United States Patent
Murphy

(10) Patent No.: US 11,074,169 B2
(45) Date of Patent: Jul. 27, 2021

(54) PROGRAMMED MEMORY CONTROLLED DATA MOVEMENT AND TIMING WITHIN A MAIN MEMORY DEVICE

(71) Applicant: Micron Technology, Inc., Boise, ID (US)

(72) Inventor: Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 653 days.

(21) Appl. No.: 13/935,303

(22) Filed: Jul. 3, 2013

(65) Prior Publication Data

US 2015/0012717 A1    Jan. 8, 2015

(51) Int. Cl.
| | |
|---|---|
| *G06F 12/02* | (2006.01) |
| *G06F 12/06* | (2006.01) |
| *G06F 12/0862* | (2016.01) |
| *G11C 7/10* | (2006.01) |

(52) U.S. Cl.
CPC ...... *G06F 12/0223* (2013.01); *G06F 12/0607* (2013.01); *G06F 12/0862* (2013.01); *G06F 2212/1024* (2013.01); *G06F 2212/1028* (2013.01); *G06F 2212/6028* (2013.01); *G11C 7/10* (2013.01); *Y02D 10/00* (2018.01)

(58) Field of Classification Search
CPC .............................................. G06F 13/28–287
See application file for complete search history.

(56) References Cited

U.S. PATENT DOCUMENTS

| | | | | |
|---|---|---|---|---|
| 5,239,639 A | * | 8/1993 | Fischer et al. ................. | 713/600 |
| 5,353,415 A | * | 10/1994 | Wolford .............. | G06F 12/0831 |
| | | | | 710/310 |
| 5,465,342 A | * | 11/1995 | Walsh ................. | G06F 12/0864 |
| | | | | 711/119 |
| 5,708,849 A | * | 1/1998 | Coke et al. ...................... | 710/22 |
| 5,790,137 A | * | 8/1998 | Derby ................. | G06F 12/0804 |
| | | | | 345/537 |

(Continued)

FOREIGN PATENT DOCUMENTS

| | | |
|---|---|---|
| JP | H09160862 | 6/1997 |
| JP | 2007072928 | 3/2007 |

(Continued)

OTHER PUBLICATIONS

Pawlowski, T. Hybrid Memory Cube (HMC). Hot Chips 23. Mircron Technology, Inc. Aug. 4, 2011. [Retrieved on Mar. 4, 2015]. Retrieved from the internet: < URL: http://www.hotchips.org/wp-content/uploads/hc_archives/hc23/HC23.18.3-memory-FPGA/HC23.18.320-HybridCube-Pawlowski-Micron.pdf>.*

(Continued)

*Primary Examiner* — Reginald G Bragdon
*Assistant Examiner* — Chie Yew
(74) *Attorney, Agent, or Firm* — Brooks, Cameron & Huebsch, PLLC

(57) ABSTRACT

The present disclosure includes apparatuses, electronic device readable media, and methods for memory controlled data movement and timing. A number of electronic device readable media can store instructions executable by an electronic device to provide programmable control of data movement operations within a memory. The memory can provide timing control, independent of any associated processor, for interaction between the memory and the associated processor.

17 Claims, 3 Drawing Sheets

(56) References Cited

U.S. PATENT DOCUMENTS

| | | | |
|---|---|---|---|
| 5,802,546 A | 9/1998 | Chisholm | |
| 5,848,068 A * | 12/1998 | Daniel et al. | 370/395.43 |
| 6,097,402 A * | 8/2000 | Case | G06F 3/14 |
| | | | 345/520 |
| 6,101,614 A * | 8/2000 | Gonzales | G06F 11/106 |
| | | | 710/39 |
| 6,145,017 A | 11/2000 | Ghaffari | |
| 6,353,438 B1 * | 3/2002 | Van Hook | G06T 1/60 |
| | | | 345/540 |
| 6,385,128 B1 * | 5/2002 | Arcoleo | G11C 8/18 |
| | | | 365/189.18 |
| 6,421,058 B2 * | 7/2002 | Parikh | G06F 12/0875 |
| | | | 345/522 |
| 6,473,818 B1 * | 10/2002 | Niu | G06F 13/387 |
| | | | 711/150 |
| 6,728,855 B2 | 4/2004 | Thiesfeld et al. | |
| 6,754,735 B2 | 6/2004 | Kale et al. | |
| 6,754,779 B1 * | 6/2004 | Magro | G06F 12/0862 |
| | | | 710/22 |
| 6,963,955 B1 * | 11/2005 | Joe | H04L 49/90 |
| | | | 709/201 |
| 7,149,867 B2 | 12/2006 | Poznanovic et al. | |
| 7,222,197 B2 | 5/2007 | Jeddeloh | |
| 7,639,628 B2 | 12/2009 | Kogge | |
| 8,074,026 B2 | 12/2011 | Kim et al. | |
| 8,198,717 B1 | 6/2012 | Schenck et al. | |
| 8,254,191 B2 | 8/2012 | Jeddeloh et al. | |
| 8,356,138 B1 * | 1/2013 | Kulkarni | G06F 17/5054 |
| | | | 711/105 |
| 8,447,962 B2 | 5/2013 | Hughes et al. | |
| 8,495,301 B1 * | 7/2013 | Alexander et al. | 711/118 |
| 2002/0194530 A1 * | 12/2002 | Santeler | G06F 11/108 |
| | | | 714/6.1 |
| 2004/0186931 A1 * | 9/2004 | Maine | G06F 13/28 |
| | | | 710/22 |
| 2005/0001847 A1 * | 1/2005 | Jeddeloh | G06F 12/0284 |
| | | | 345/532 |
| 2005/0060441 A1 | 3/2005 | Schmisseur | |
| 2005/0114356 A1 * | 5/2005 | Bhatti | G06F 17/30115 |
| 2005/0235072 A1 * | 10/2005 | Smith et al. | 710/22 |
| 2006/0064517 A1 * | 3/2006 | Oliver | G06F 13/28 |
| | | | 710/22 |
| 2007/0058451 A1 | 3/2007 | Uchida | |
| 2007/0162528 A1 * | 7/2007 | Wright | G06F 12/0253 |
| 2007/0266206 A1 | 11/2007 | Kim et al. | |
| 2008/0005390 A1 * | 1/2008 | Couvert | G06F 13/28 |
| | | | 710/24 |
| 2008/0007561 A1 * | 1/2008 | Thompson | G06F 12/0888 |
| | | | 345/557 |
| 2008/0082751 A1 * | 4/2008 | Okin | G06F 13/1668 |
| | | | 711/115 |
| 2008/0086617 A1 * | 4/2008 | Kasahara et al. | 711/167 |
| 2008/0183984 A1 | 7/2008 | Beucler et al. | |
| 2009/0002385 A1 * | 1/2009 | Blixt | 345/555 |
| 2009/0172364 A1 * | 7/2009 | Sprangle | G06F 9/30043 |
| | | | 712/225 |
| 2010/0036997 A1 * | 2/2010 | Brewer et al. | 711/5 |
| 2010/0070696 A1 * | 3/2010 | Blankenship | G06F 13/4243 |
| | | | 711/105 |
| 2010/0110745 A1 * | 5/2010 | Jeddeloh | G06F 13/4239 |
| | | | 365/51 |
| 2010/0121994 A1 | 5/2010 | Kim et al. | |
| 2010/0211745 A1 | 8/2010 | Jeddeloh | |
| 2010/0238693 A1 | 9/2010 | Jeddeloh | |
| 2011/0246746 A1 | 10/2011 | Keeth et al. | |
| 2012/0102275 A1 | 4/2012 | Resnick | |
| 2012/0158682 A1 * | 6/2012 | Yarnell et al. | 707/704 |
| 2012/0161316 A1 * | 6/2012 | Gonzalez | H01L 21/568 |
| | | | 257/738 |
| 2012/0250443 A1 * | 10/2012 | Saraswat | G11C 5/14 |
| | | | 365/226 |
| 2012/0254591 A1 | 10/2012 | Hughes et al. | |
| 2012/0256653 A1 | 10/2012 | Cordero et al. | |
| 2012/0284436 A1 * | 11/2012 | Casper et al. | 710/74 |
| 2013/0039112 A1 | 2/2013 | Riho | |
| 2013/0148402 A1 * | 6/2013 | Chang et al. | 365/63 |
| 2014/0040596 A1 * | 2/2014 | Fleischer et al. | 712/205 |
| 2014/0095831 A1 * | 4/2014 | Grochowski et al. | 712/205 |

FOREIGN PATENT DOCUMENTS

| | | | | |
|---|---|---|---|---|
| JP | 2007524905 | | 8/2007 | |
| JP | 2010187180 | | 8/2010 | |
| JP | 2011134318 | | 7/2011 | |
| JP | 2012521612 | | 9/2012 | |
| JP | 2013097410 | | 5/2013 | |
| JP | 2013516020 | | 5/2013 | |
| KR | 20110127193 | | 11/2011 | |
| KR | 20130018812 | | 2/2013 | |
| TW | 201246065 | | 11/2012 | |
| WO | WO 9934273 A2 * | 7/1999 | | G06F 13/28 |

OTHER PUBLICATIONS

Bogdanski, Jack. System in Package: Better performance, smaller footprint. Article [online]. Feb. 19, 2009[retrieved on May 5, 2016]. Retrieved from the Internet <http://embedded-computing.com/articles/system-package-performance-smaller-footprint/>.*

Data Structure. Article [online]. NIST, Dec. 15, 2004 [retrieved on Feb. 24, 1998]. Retrieved from the Internet <https://xlinux.nist.gov/dads/HTML/datastructur.html>.*

Zhang, et al., "The Impulse Memory Controller", Accessed at: http://www.cs.utah.edu/impulse/papers/tocs2001.ps, Sep. 24, 2001 (35 pages).

International Search Report and Written Opinion for related PCT Application No. PCT/US2014/043384, dated Oct. 24, 2014, 12 pages.

Office Action for related Taiwan Patent Application No. 103123051, dated Nov. 16, 2015, 15 pages.

Seshadri, et al., "Gather-Scatter DRAM: In-DRAM Address Translation to Improve the Spatial Locality of Non-unit Strided Accesses", Dec. 5-9, 2015, (14 pgs.), Proceedings of the 48th International Symposium on Microarchitecture.

Office Action for related Japan Patent Application No. 2016-523813, dated Mar. 14, 2017, 6 pages.

European Search Report and Written Opinion for related EP Patent Application No. 14820229.4, dated Feb. 10, 2017, 11 pages.

Office Action for related Japan Patent Application No. 2016-523813, dated Aug. 22, 2017, 9 pages.

Office Action for related Korea Patent Application No. 10-2016-7002507, dated Sep. 5, 2017, 9 pages.

Office Action for related China Patent Application No. 201480038337.X, dated Nov. 30, 2017, 21 pages.

Notice of Rejection for related Korea Patent Application No. 10-2016-7002507, dated Dec. 7, 2018, 9 pages.

Communication Pursuant to Article 94(3) EPC for related EP Application No. 14820229.4, dated Jan. 2, 2019, 9 pages.

Anonymous, "Hybrid Memory Cube Specification 1.0", Hybrid Memory Consortium, May 13, 2013, pp. FP-121.

Scheuermann et al., "Efficient Histogram Generation Using Scattering GPUs" Proceedings of the 2007 ACM SIGGRAPH Symposium on Interactive 3D Graphics and Games, Seattle, WA, Apr. 30-May 2, 2007, pp. 33-37.

Draper et al., "The Architecture of the DIVA Processing-in-Memory Chip", Proceedings of the 2002 International Conference on Supercomputing, New York, NY, Jun. 22-26, 2002, pp. 14-25.

Extended European Search Report and Written Opinion for related EP Application No. 19197613.3, dated Jan. 27, 2020, 13 pgs.

* cited by examiner

PROGRAMMED MEMORY CONTROLLED DATA MOVEMENT AND TIMING WITHIN A MAIN MEMORY DEVICE

TECHNICAL FIELD

The present disclosure relates generally to semiconductor memory and methods, and more particularly, to apparatuses, electronic device readable media, and methods for memory controlled data movement and timing.

BACKGROUND

Memory devices are typically provided as internal, semiconductor, integrated circuits in computing devices or other electronic devices. There are many different types of memory including volatile and non-volatile memory. Volatile memory can require power to maintain its data (e.g., user data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Computing devices typically include a number of processors coupled to a main memory (e.g., DRAM) and a secondary memory (e.g., storage, such as a hard drive or solid state drive). Main memory interfaces are typically tightly coupled or slaved to the processor. In DRAM, this is accomplished by the processor's memory controller managing explicitly timed interfaces (e.g., via a row address strobe (RAS)/column address strobe (CAS) protocol). Memory has typically been optimized for density and processors have typically been optimized for speed, causing a disparity between the two known as the memory wall or the von Neumann bottleneck. This disparity typically results in bandwidth between the processor and memory being a more limiting resource than the speed of the processor or the density of the memory.

DETAILED DESCRIPTION

Figure 1:
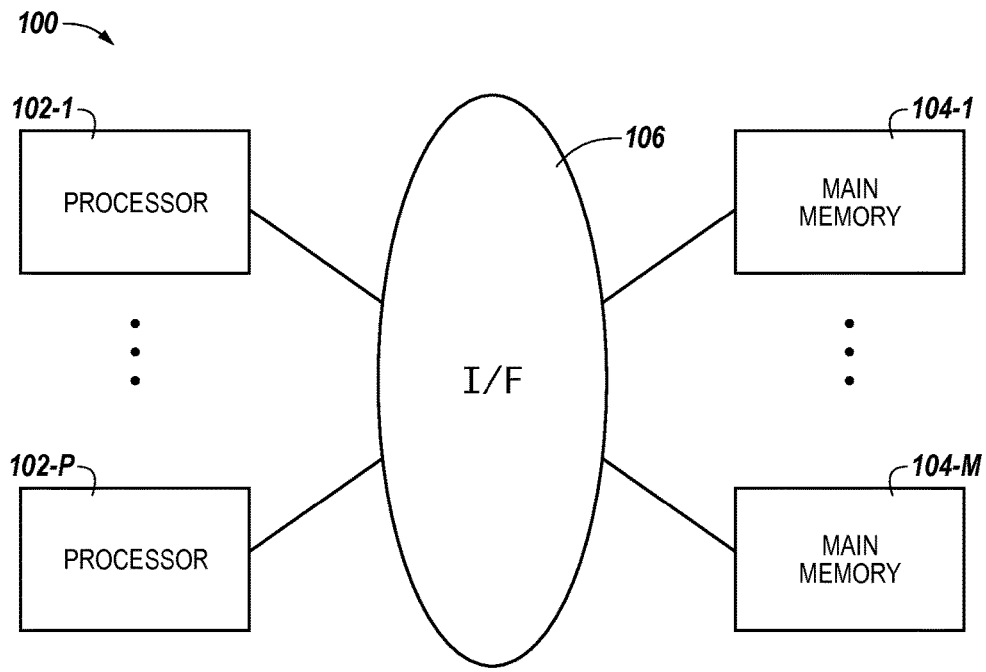
FIG. 1 illustrates a block diagram of an apparatus in the form of a computing device including a number of processors, a number of main memory devices, and an interface therebetween in accordance with a number of embodiments of the present disclosure.

An abstracted memory interface between a processor and a main memory can provide for decoupled timing (and, in some instances, decoupled naming) from explicit control by the processor. An example of a main memory with an abstracted interface is a hybrid memory cube (HMC). In HMC, this function is achieved by a packetized network protocol coupled with hardware logic (e.g., logic-layer memory control). Such interfaces can allow for a simplified processor-side memory controller interface, out-of-order return of main memory request, localized RAS and/or CAS management of the main memory, advanced memory topologies and sharing strategies in multiprocessor apparatuses, both homogeneous and heterogeneous, locally managed synchronization functions and metadata storage, and resilience (e.g., where failed portions of memory such as words or blocks can be remapped, such as by a logic layer in memory).

Applications such as high performance computing, graph-based analysis, data mining, national security, database technology, and other commercial drivers exhibit sparse memory access patterns ill-suited to the cache based architecture of many processors in which data generally exhibits poor spatial locality and/or temporal locality. Generalized data movement functions for main memory can afford an opportunity to better utilize memory bandwidth and cache based architectures.

The present disclosure includes apparatuses, electronic device (e.g., computing device) readable media, and methods for memory controlled data movement and timing. A number of electronic device readable media store instructions executable by an electronic device to provide programmable control of data movement operations within a memory (e.g., a main memory). The main memory can provide timing control, independent of any associated processor, for interaction between the memory and the associated processor. As will be appreciated by one of ordinary skill in the art, "main memory" is a term of art that describes memory storing data that can be directly accessed and manipulated by a processor. An example of main memory is DRAM. Main memory provides primary storage of data and can be volatile memory or non-volatile memory (e.g., in the case of non-volatile RAM managed as a main memory, such as a non-volatile dual in-line memory module (DIMM)). Secondary storage can be used to provide secondary storage of data and may not be directly accessible by the processor. However, as used herein, "main memory" does not necessarily have to be volatile memory, and can in some embodiments be non-volatile memory.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "B", "L", "M", "N", and "P", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 206 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 illustrates a block diagram of an apparatus in the form of a computing device 100 including a number of processors 102-1, . . . , 102-P, a number of main memory devices 104-1, . . . , 104-M, and an interface 106 therebetween in accordance with a number of embodiments of the present disclosure. As used herein, a computing device 100, a processor 102, a memory device 104, or an interface 106 might also be separately considered an "apparatus." The computing device 100 can be any electronic device including a processor and main memory storing data that is accessed by the processor. Examples of computing devices 100 include supercomputers, personal computers, video cards, sound cards, and mobile electronic devices such as laptop computers, tablets, smartphones, and the like.

The processors 102-1, . . . , 102-P can be any type of general purpose processors. For example, the processors 102-1, . . . , 102-P can be cache based processors, vector processors (e.g., single instruction multiple data (SIMD)), scalar processors (e.g., single instruction single data (SISD)), multiple instruction single data (MISD), multiple instruction multiple data (MIMD) processors, etc. In some embodiments, the processors 102-1, . . . , 102-P do not provide timing control of the main memory devices 104-1, . . . , 104-M. The processors 102-1, . . . , 102-P can be configured to send a request via the interface 106 to the main memory devices 104-1, . . . , 104-M without being aware of a read time associated with the request (e.g., the processors 102-1, . . . , 102-P may not control and/or be aware of when the requested data will be received by the processors 102-1, . . . , 102-P). The request from the processors 102-1, . . . , 102-P may not have timing associated therewith, leaving the determination when to respond to the request to the main memory devices 104-1, . . . , 104-M.

The main memory devices 104-1, . . . , 104-M can store data that is operated on by the processors 102-1, . . . , 102-P. Examples of main memory devices include DRAM and HMC, among others. However, according to a number of embodiments of the present disclosure, the main memory devices 104-1, . . . , 104-M can control their timing independently of the processors 102-1, . . . , 102-P for interaction between the main memory devices 104-1, . . . , 104-M and the processors 102-1, . . . , 102-P. For example, the main memory devices 104-1, . . . , 104-M can provide their own timing control of a row address strobe (RAS) and/or a column address strobe (CAS) for accessing the main memory devices 104-1, . . . , 104-M. Examples of such timing control include random read or write cycle time, access time, etc.

In some embodiments, programmable control of data movement operations within the main memory devices 104-1, . . . , 104-M can be provided (e.g., by executable instructions provided by a programmer). Examples of such operations include gather/scatter operations, addressed based operations, offset based operations, strided operations, pointer based operations, etc. Enhanced data movement semantics can be exposed to the programmer (according to some previous approaches, the programmer was not provided with an ability to control data movement operations in a main memory 204). Such embodiments can be beneficial in allowing instructions to be written that reduce use of the bandwidth of the interface 106 by moving data within the main memory devices 104-1, . . . , 104-M before it is transferred across the interface 106 to the processors for further operation. Benefits can include reducing the overall latency of computation or a sequence of such operations. More specific examples of such movement operations within the main memory devices 104-1, . . . , 104-M are described herein. For example, the main memory devices 104-1, . . . , 104-M can store a data structure and traverse the data structure independent of an instruction stream from the processors 102-1, . . . , 102-P. Although the processors 102-1, . . . , 102-P may request certain data from the main memory devices 104-1, . . . , 104-M, the main memory devices 104-1, . . . , 104-M can independently traverse the data structure and move data in order to more efficiently (e.g., in terms of use of bandwidth of the interface 106) respond to the request for data from the processors 102-1, . . . , 102-P, although the request from the processors 102-1, . . . , 102-P did not specifically request the data movement. In addition to more efficiently utilizing the bandwidth of the interface 106, embodiments of the present disclosure can reduce a power consumption associated with use of the interface 106 by transmitting across the interface 106 fewer times for equivalent results (e.g., transmitting dense data, which requires fewer transfers than transmitting sparse data).

Figure 2:
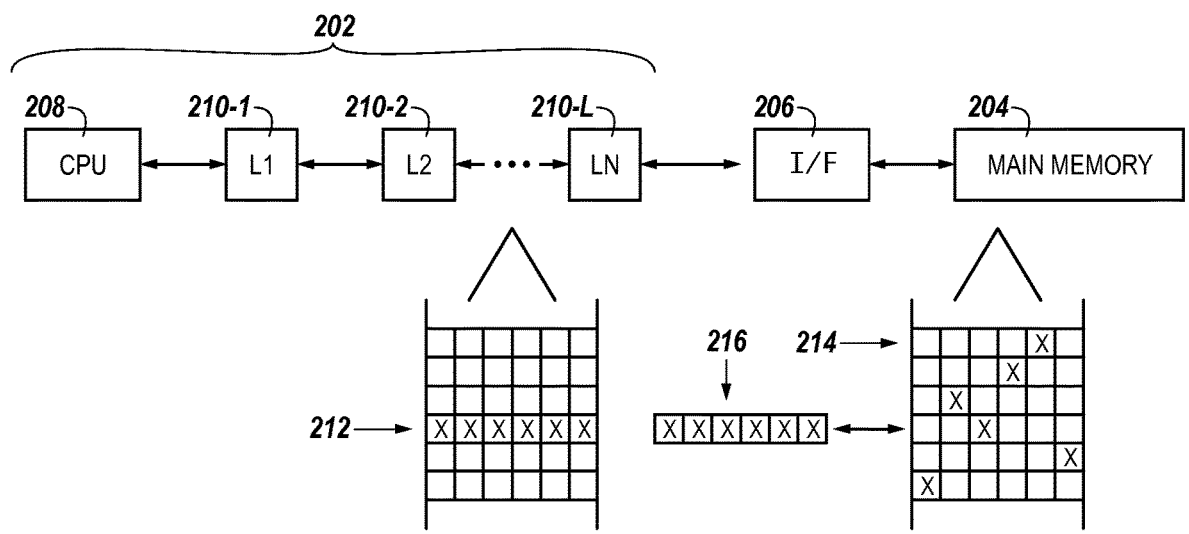
FIG. 2 illustrates a data movement operation between a processor and a main memory in accordance with a number of embodiments of the present disclosure.

FIG. 2 illustrates a data movement operation between a processor 202 and a main memory 204 in accordance with a number of embodiments of the present disclosure. The processor 202 can be analogous to the processors 102-1, . . . , 102-P illustrated in FIG. 1. The processor 202 can be a cache based processor and can include, for example, a processing unit (e.g., a central processing unit "CPU") 208, a first level cache "L1" 210-1 coupled to the processing unit 208, a second level cache "L2" 210-2 coupled to the first level cache 210-1, and a number of additional levels of cache "LN" 210-L coupled to the second level cache 210-2. The first level cache 210-1, second level cache 210-2, and additional levels of cache 210-L may be referred to herein generically as cache 210. Embodiments are not limited to a particular number of levels of cache and can include more or fewer than those illustrated in FIG. 2. The cache 210 can be used by the processing unit 208 to reduce average time to access the main memory 204 by storing frequently used data from the main memory 204. The latency for accessing the cache 210 by the processing unit 208 is less than the latency for accessing the main memory 204 by the processing unit 208 via the interface 206. The interface 206 can be analogous to the interface 106 illustrated in FIG. 1 and the main memory 204 can be analogous to the main memory devices 104-1, . . . , 104-M illustrated in FIG. 1.

FIG. 2 also illustrates a representation of a cache line 212 in the cache 210. Each row in the diagram under the cache 210 represents a cache line and a particular cache line 212 is illustrated with data as indicated by the "x" in each block. A cache 210 can have a fixed cache line size (e.g., a certain number of bytes of data that can be stored in a cache line). Interactions with the cache (e.g., from the main memory 204) can occur in fixed data increments that are equal to a single cache line sized portion of data. According to a number of embodiments of the present disclosure, the main memory 204 can be configured to respond to a request for data from the processor 202 by gathering data that is distributed in the main memory 204 into a single cache line sized portion of data 216. With respect to FIG. 2, the data that is distributed in the main memory 204 is represented by the "x" entries in the rows 214 of the main memory 204. The main memory can be configured to gather the data (x's), as shown, into a single cache line sized portion of data 216 before transferring the data across the interface 206 to the processor 202. As is illustrated, the requested data can be non-contiguously distributed in the main memory 204 such that the requested data and surrounding data comprises a plurality of cache line sized portions of data. As described herein, the main memory 204 can control a timing of the operation (e.g., the gather operation) and the processor 202 may be unaware of a read time associated with the request for data (e.g., the processor may not know or control when the data will be sent from the main memory 204 to the processor 202).

In contrast, some previous approaches to accessing the main memory 204 included the processor 202 controlling the timing of the operation. Furthermore, such a request for data would have been met with a plurality of responses from the main memory 204 by transferring each row 214 containing the requested data (x's) without first gathering the data into a single cache line sized portion of data 216. Such previous approaches would consume more bandwidth of the interface 206, because each row 214 would be sent separately across the interface, potentially with non-requested data (e.g., surrounding data (represented by the blank boxes) that was not requested by the processor 202). It would then be up to the processor 202 to process (e.g., filter) the data received from the main memory 204 to isolate and further operate on the requested data (e.g., the x's). However, according to the present disclosure, the requested data can be sent to the processor without sending the non-requested data.

According to a number of embodiments of the present disclosure, the request from the processor can include an indication of a number of attributes. An attribute can be a specification that defines a property of an object, element, or file. The attribute may refer to the specific value for a given instance of data. For example, where the main memory stores data comprising an image, an attribute of the image may be pixel values that have a particular color (where the particular color is the attribute). In response to a request from the processor for attributes stored in the main memory 204, the main memory 204 can examine a data structure stored in the main memory to determine whether the data structure includes the attribute. The main memory 204 can return data that indicates the attribute (e.g., data indicating a particular color in an image) to the processor 202 in response to determining that the data structure includes the attribute. The number of attributes can be attributes that are to be gathered from the main memory 204 or attributes that are to be scattered to the main memory 204. Examples of the type of request (from the processor 202) for which gather operations may be particularly beneficial are search requests (e.g., "among the data stored in the data structure, please return values that match a criteria," where the "x's" represent the data that matches the criteria) and filter requests (e.g., "among the data stored in the data structure, please return values for which a given predicate returns a Boolean true value," where the "x's" represent the data that returns a Boolean true value for the predicate).

According to some embodiments of the present disclosure, after the processor 202 has modified the requested data, it can return the modified data to the main memory device 204. The main memory device 204 can receive the modified data (e.g., a single cache line sized portion of modified data 216) scatter the modified data such that it is stored in the data structure of the main memory device 204 in the same locations from which the requested data was gathered. Thus, programmable control can be provided over data movement operations (e.g., gather and/or scatter operations) within the main memory 204.

The main memory 204 (e.g., hardware logic associated with the main memory 204) can be configured to provide an indication that locations in the main memory 204, from which data is gathered, are unavailable until the gathered data is released by the processor 202. Such embodiments can provide a synchronization mechanism (e.g., so that stale data is not delivered in response to another request such as a direct memory access (DMA) request or a request from another processor). The indication can be a table, a full/empty bit, or a series of base and bounds registers, among other indications.

In a number of embodiments, the request from the processor 202 can be for data to be modified by the main memory 204, where the data is distributed in a data structure of the main memory 204. The main memory 204 (e.g., hardware logic thereof) can be configured to provide modifications to data within the main memory 204 (e.g., via processing in memory (PIM)). In response to the request, the main memory 204 can originate and perform a data gather operation in the main memory 204 based on the data structure. The main memory 204 can be configured to originate and perform a data modify operation on the gathered data in the main memory (e.g., without transferring the data across the memory interface 206 and/or without use of a processor). An example of a modification operation includes adjusting a value of the gathered data (e.g., each unit of the gathered data). Such an example may be beneficial where the apparatus is, for example, a video card and the requested modification is, for example, to increase a brightness of a particular color in an image stored in the main memory 204 before the processor 202 performs a more complicated operation on the data comprising the image or transfers it to a peripheral device (e.g., a monitor). The main memory 204 can be configured to send the modified data to the processor 202 after completing the modification. As described herein, the main memory 204 can control timing of the main memory 204 independent of the processor 202. For those embodiments in which the main memory 204 includes an ability to modify data (as well as move data) without direct processor 202 control, the main memory 204 can be treated as a peer of the processor 202 (e.g., the main memory 204 can be treated as an extension of the processor's 202 cache 210 to extend the address space).

Figure 3:
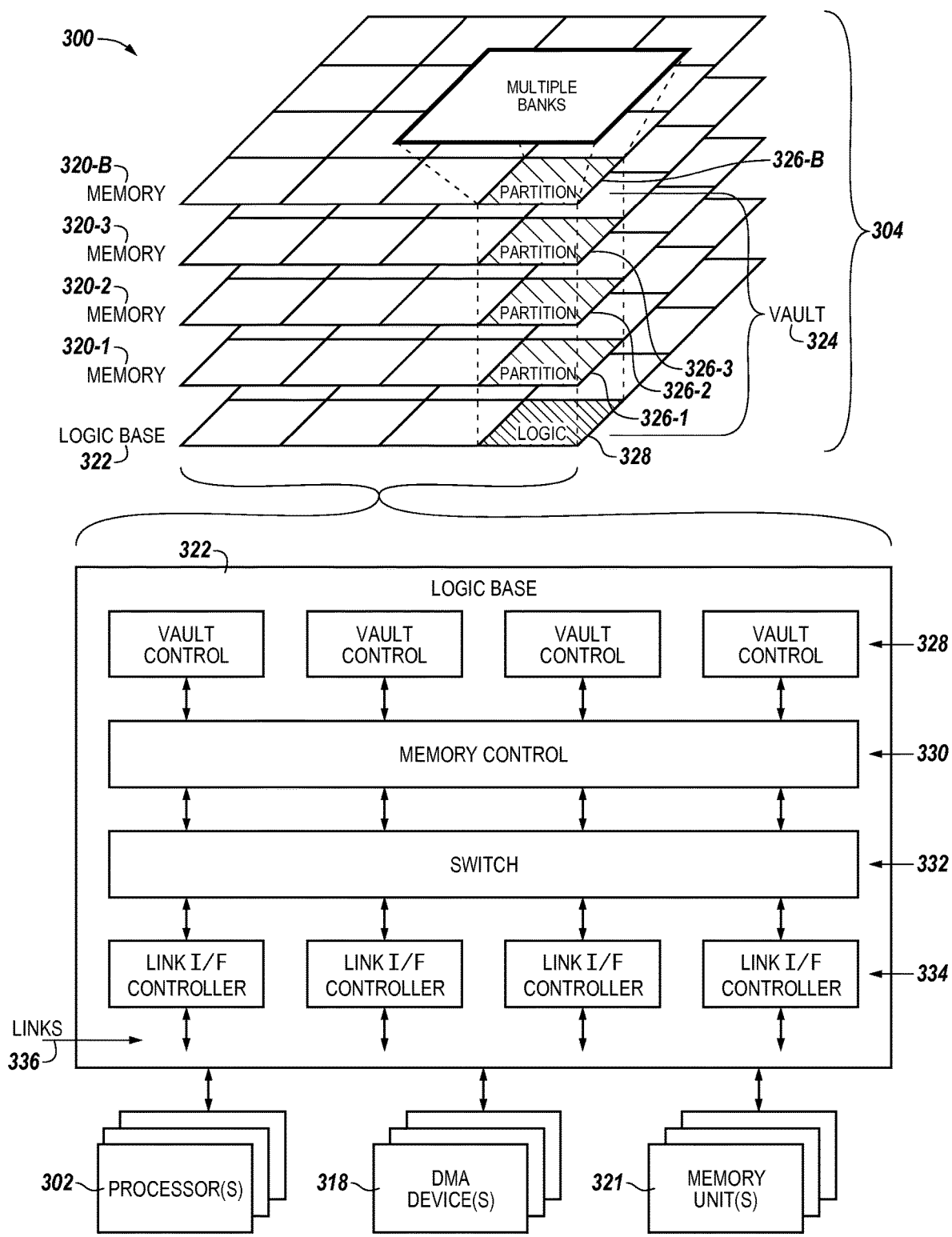
FIG. 3 includes an illustration of a more detailed view of a logic device coupled between the memory devices and the requesting devices in accordance with a number of embodiments of the present disclosure.

FIG. 3 illustrates a block diagram of an apparatus in the form of a computing device 300 including a main memory device 304 and a number of requesting devices 302, 318, 321 in accordance with a number of embodiments of the present disclosure. Examples of requesting devices can include a processor 302, a DMA device 318, and/or a memory unit 321, among others. The processor(s) 302 can be analogous to the processors 102-1, . . . , 102-P illustrated in FIG. 1. The memory unit 321 can be analogous to the main memory 104 illustrated in FIG. 1 and/or to another memory unit other than a main memory. The computing device 300 can be analogous to the computing device 100 illustrated in FIG. 1. In FIG. 3, more detail is shown regarding a specific example of a main memory 304 that is a hybrid memory cube (HMC). The main memory HMC 304 illustrated in FIG. 3 can be analogous to the main memory devices 104-1, . . . , 104-M illustrated in FIG. 1.

An HMC 304 can be a single package including multiple memory devices 320-1, 320-2, 320-3, . . . , 320-B (e.g., DRAM dies) and hardware logic device 322 (e.g., a logic die, application-specific integrated circuit (ASIC), corresponding logic in another device, etc.) stacked together using through silicon vias (TSV), although other embodiments may differ (e.g., the hardware logic device 322 may not necessarily be stacked with the memory devices 320). The memory within the HMC 304 can be organized into subsets (e.g., vaults) 324, where each vault 324 is functionally and operationally independent of other vaults 324. Each vault 324 can include a partition of memory from each of the memory devices 320. Each vault 324 can include a hardware logic unit 328 (e.g., vault controller) in the logic device 322 that functions analogously to a memory controller for the vault 324. Each vault controller 324 can be coupled to a respective subset of the plurality of memory devices 320. For example, the vault controller 328 can manage memory operations for the vault 324 including determining its own timing requirements (e.g., instead of being managed by a requesting device such as a processor). The vault controller 328 can include a number of buffers for requests and responses with a processor 302 and can utilize the number of buffers to send responses to the processor 302 out of order with respect to an order in which the requests were received from the processor 302. Thus, the processor 302 can be configured to send a request via an interface to the HMC 304 without being aware of a read time associated with the request.

FIG. 3 includes an illustration of a more detailed view of a logic device 322 coupled between the memory devices 320 and the requesting devices 302, 318, 321. The logic base 322 can include memory control logic 328 for each vault (e.g., vault control). The vault controller 328 can be coupled to a shared memory control logic 330 for the HMC 304 that can consolidate functions of the vaults 324. However, the shared memory control logic 330 does not necessarily comprise a central memory controller in the traditional sense because each of the vaults 324 can be directly controlled (e.g., controlled timing, access, etc.) independently of each other and because the shared memory control logic 330 does not necessarily interface (e.g., directly interface) with the requesting devices 302, 318, 321. Thus, in some embodiments, the computing device 300 and/or the main memory 304 does not include a central memory controller. The memory control logic 330 can be coupled to a switch 332 (e.g., a crossbar switch). The switch 332 can provide availability of the collective internal bandwidth from the vaults 324 to the input/output (I/O) links 336. The switch 332 can be coupled to link interface controllers 334, which control I/O links 336 to a requesting device 302, 318, 321. For example, the I/O links 336 can be serial fully duplexed input/output links. The logic device 322 can provide a logical/physical interface for the main memory 304.

The main memory 304 can receive requests from requesting devices such as a processor 302, a DMA device 318, and/or a memory unit 321, among others. As described herein, in some embodiments, the main memory 304 can be configured to provide an indication that locations in the main memory 304, from which data is gathered, are unavailable until the gathered data is released by the requesting device 302, 318, 321. Such embodiments can provide a synchronization mechanism (e.g., so that stale data is not delivered in response to a request from the DMA device 318 while the data is being operated on by the processor 302).

Figure 4:
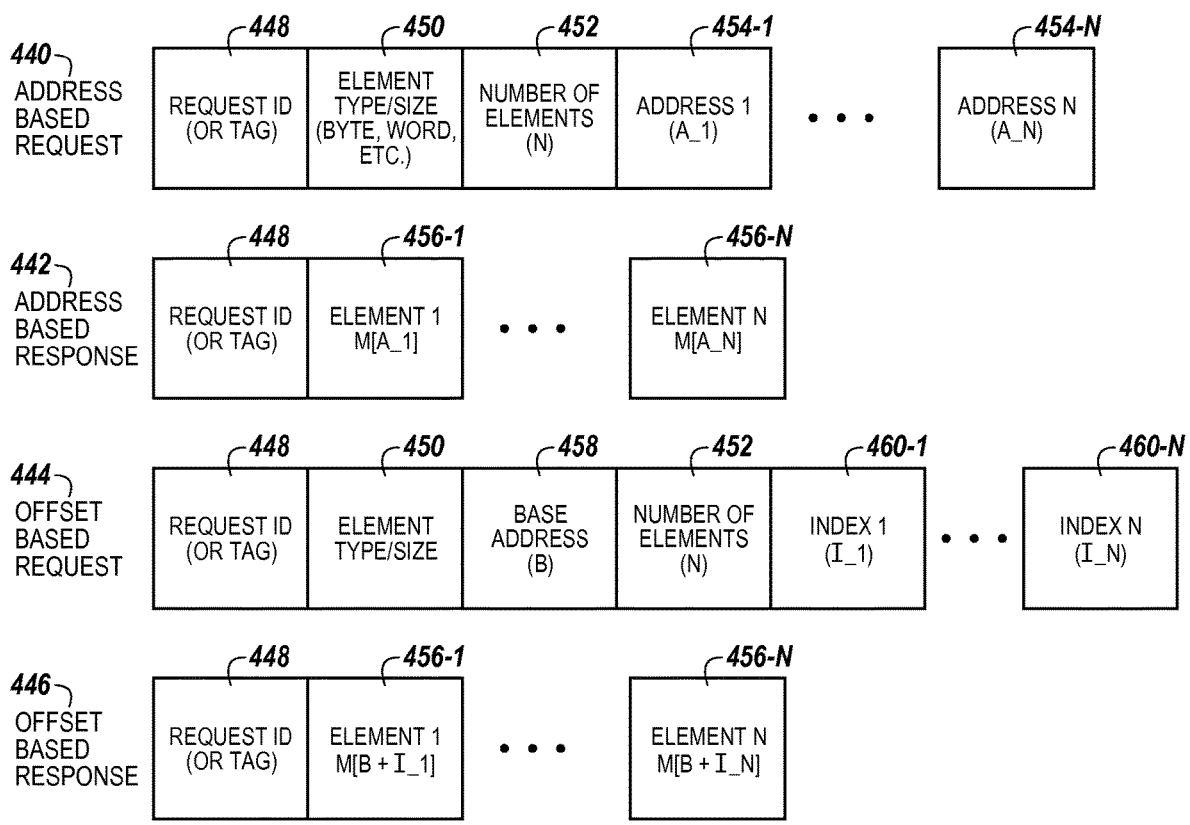
FIG. 4 illustrates a block diagram of a number of address and offset based requests and responses in accordance with a number of embodiments of the present disclosure.

FIG. 4 illustrates a block diagram of a number of address and offset based requests and responses in accordance with a number of embodiments of the present disclosure. A requesting device (e.g., a number of cache based processors) can provide a request to a main memory device and, in some embodiments, the request can include a tag 448 to allow for buffering by the requesting device until the main memory device responds to the request. Because the main memory device controls the timing of operations in response to requests from the requesting device, the requesting device can benefit from keeping track of tags 448 for its requests so that when the main memory device responds to the request, the requesting device can quickly identify to which request the response applies based on the tag 448. The main memory device can store a data structure (e.g., a linked list, a tree, and a graph, among others) and be configured to traverse the data structure in response to the request from the requesting device. Requests can include address based requests 440, offset based requests 444, strided requests, and pointer based requests, among others. The main memory device can be configured to respond in kind (e.g., an address based request 440 can be met with an address based response 442 and an offset based request 444 can be met with an offset based response 446, etc.).

An address based request can include a tag 448 that identifies the request, an indication of a type and/or size of requested elements 450 (e.g., a number of bytes, words, etc.), an indication of a number of requested elements 452, and a number of addresses 454-1, . . . , 454-N where the elements are stored. An address based response can include the tag 448 and the data elements 456-1, . . . , 456-N corresponding to the request.

An offset based request can include a tag 448 that identifies the request, an indication of a type and/or size of requested elements 450 (e.g., a number of bytes, words, etc.), a base address 458, an indication of a number of requested elements 452, and a number of offset indices 460-1, . . . , 460-N where the elements are stored. An offset based response can include the tag 448 and the data elements 456-1, . . . , 456-N corresponding to the request.

Although not specifically illustrated, a strided request can be similar to an offset based request in that the request can include a tag that identifies the request, an indication of a type and/or size of requested elements (e.g., a number of bytes, words, etc.), a base address, and an indication of a number of requested elements. However, instead of including offsets, the strided request includes a stride (e.g., a number that can be added to the base address or the previously accessed address to find the next desired address). A strided response can include the tag and the data elements corresponding to the request.

Although not specifically illustrated, a pointer based request can include a pointer to a data structure in the main memory, an indication of a number of attributes (e.g., a number of attributes to be gathered by the main memory from the data structure and returned to the requesting device), and indication of a list of pointers to be dereferenced (e.g., including an indication of how many pointers are to be dereferenced), and a number of conditions and corresponding operations for the request. The main memory can examine the data structure according to the pointer, the indication of the number of attributes, and the indication of the list of pointers and perform an operation in response to a corresponding condition being met. The main memory can examine the data structure by dereferencing the list of pointers until an end of the list is reached or until a threshold number of the pointers have been dereferenced. Dereferencing a pointer can include retrieving data indicated by the pointer (e.g., retrieving data from a location in the main memory indicated by the pointer). Examining the data structure can include determining whether the data structure referenced by a particular pointer includes the attribute and the main memory can return data including the attribute to the requesting device in response to determining that the data structure referenced by the pointer includes the attribute. In some embodiments, the main memory can generate a new request by cloning the request from the requesting device in response to determining that the data structure referenced by the pointer includes the attribute.

Examples of conditions and corresponding operations include returning data including an attribute to the requesting device in response to the data matching a set value or search key. Another example includes performing an atomic update of data including an attribute in response to a match. Another example includes ending operations for the request in response to a remaining number of pointers being a sentinel value (e.g., a value that causes the operations to end, for example, zero) or a threshold number of pointers having been dereferenced. Examples of the data structure include a linked list, a tree, and a graph.

Although not specifically illustrated as such, a non-transitory computing device readable medium for storing executable instructions can include all forms of volatile and non-volatile memory, including, by way of example, semiconductor memory devices, DRAM, HMC, EPROM, EEPROM, flash memory devices, magnetic disks such as fixed, floppy, and removable disks, other magnetic media including tape, optical media such as compact discs (CDs), digital versatile discs (DVDs), and Blu-Ray discs (BD). The instructions may be supplemented by, or incorporated in, ASICs.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device comprising:
   a plurality of memory dies stacked on one another; and
   a hardware logic device comprising a plurality of vault controllers and configured to:
   gather data that is distributed non-contiguously in the plurality of memory dies in response to a request for the data from at least one of a plurality of requesting devices;
   modify the gathered data in order to adjust a value of each unit of the gathered data; and
   transfer the modified gathered data to the at least one of the plurality of requesting devices,
   wherein the plurality of memory dies are stacked on the hardware logic device such that the plurality of memory dies and the hardware logic device form a single package,
   wherein the plurality of memory dies are divided into a plurality of vaults, wherein each of the plurality of vaults comprises:
   a partition of memory from each of the plurality of memory dies; and
   a vault controller configured to manage memory operations associated with a corresponding one of the plurality of vaults,
   wherein each of the plurality of vaults is functionally and operationally independent, wherein each of the plurality of vaults comprises a partition of memory from each of the plurality of memory dies.

2. The memory device of claim 1, wherein the data is associated with an image, and
   wherein the gathered data includes pixel values, wherein each of the pixel values correspond to a particular color in the image.

3. The memory device of claim 1, wherein the memory device is coupled to the plurality of requesting devices.

4. The memory device of claim 1, wherein the memory device is a main memory device.

5. The memory device of claim 4, wherein the main memory device provides primary storage of data.

6. A main memory device, comprising:
   a plurality of dynamic random access memory (DRAM) dies, wherein the plurality of DRAM dies are divided into a plurality of vaults each including a partition of memory from each of the plurality of DRAM dies, and wherein each of the plurality of vaults is functionally and operationally independent; and
   a hardware logic device coupled to the plurality of DRAM dies and configured to:
   gather data that is distributed non-contiguously in the plurality of DRAM dies into a single contiguous cache line sized portion of the distributed data in response to a request for the data from any one of a plurality of requesting devices coupled to the main memory device,
   wherein the plurality of requesting devices include a plurality of types of requesting devices and a direct memory access (DMA) device;
   control timing of gathering the data, independent of the plurality of requesting devices, such that the hardware logic device determines when to transfer the single contiguous cache line sized portion of the distributed data in response to the request, wherein the timing control includes a read cycle time, a write cycle time, and an access time for the request; and
   transfer the single contiguous cache line sized portion of the distributed data across a logical/physical interface of the hardware logic device to a cache line of the one of the plurality of requesting devices, comprising a processor, in response to the request.

7. The main memory device of claim 6, wherein the hardware logic device is configured to gather the data according to a received base address, a received stride, a received indication of a number of data elements requested, and a received indication of a data element size.

8. The main memory device of claim 6, wherein the main memory device does not include a central memory controller.

9. The main memory device of claim 6, wherein the hardware logic device includes a plurality of logic units each coupled to a corresponding one of the plurality of vaults.

10. The main memory device of claim 6, wherein the logical/physical interface of the hardware logic device includes:
  a switch; and
  a plurality of links coupled to the switch and configured to be coupled to any one of the plurality of types of requesting devices.

11. The main memory device of claim 6, wherein the hardware logic device is configured to provide an indication that locations in the plurality of DRAM dies from which the data was gathered are unavailable until the gathered data is released by one of the plurality of requesting devices from which the request originated.

12. The main memory device of claim 6, wherein the main memory device comprises a hybrid memory cube (HMC).

13. A system, comprising:
  a plurality of requesting devices including a plurality of cache based processors; and
  a plurality of hybrid memory cubes (HMCs), wherein each of the HMCs comprises a plurality of memory dies and a hardware logic device stacked together to form a single package,
  wherein the plurality of memory dies are divided into a plurality of vaults each including a partition of memory from each of the plurality of memory dies, and wherein each of the plurality of vaults is functionally and operationally independent, and
  wherein the hardware logic device comprises a plurality of vault controllers, serves as an interface between the plurality of requesting devices and a corresponding one of the plurality of HMCs, and is configured to:
    control timing of memory operations associated with a corresponding one of the plurality of HMCs, wherein the timing control includes a read cycle time, a write cycle time, and an access time for a request for data received from any one of the plurality of requesting devices;
    traverse a data structure stored in the corresponding one of the plurality of HMCs and move data within the data structure into a single contiguous cache line sized portion of data in order to efficiently respond to the request independent of an instruction stream from any of the plurality of cache based processors associated with the request; and
    transfer the single contiguous cache line sized portion of the moved data to the one of the plurality of requesting devices.

14. The system of claim 13, wherein the plurality of cache based processors comprise a plurality of vector processors,
  wherein the plurality of requesting devices do not control timing of memory operations associated with the plurality of HMCs,
  wherein each of the plurality of requesting devices is configured to provide a request to the plurality of HMCs, and
  wherein the request includes a tag to allow for buffering by the plurality of vector processors until the plurality of HMCs respond to the request.

15. The system of claim 14, wherein each of the plurality of HMCs is configured to traverse the data structure to gather data in response to the request, wherein the request comprises an address based request.

16. The system of claim 14, wherein each of the plurality of HMCs is configured to traverse the data structure to gather data in response to the request, wherein the request comprises an offset based request.

17. The system of claim 13, wherein the hardware logic device of each of the plurality of HMCs is further configured to control timing of a row address strobe (RAS) or a column address strobe (CAS) of the corresponding one of the plurality of HMCs.

* * * * *